(12) United States Patent
Shin et al.

(10) Patent No.: US 8,993,420 B2
(45) Date of Patent: Mar. 31, 2015

(54) METHODS OF FORMING EPITAXIAL LAYERS

(71) Applicant: Samsung Electronics Co., Ltd., Suwon-Si, Gyeonggi-Do (KR)

(72) Inventors: Joong-han Shin, Seoul (KR); Bong-jin Kuh, Suwon-si (KR); Ki-chul Kim, Seongnam-si (KR); Jeong-meung Kim, Seoul (KR); Eun-ha Lee, Seoul (KR); Jong-sung Lim, Seoul (KR); Han-mei Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/133,944

(22) Filed: Dec. 19, 2013

(65) Prior Publication Data

US 2014/0256117 A1 Sep. 11, 2014

(30) Foreign Application Priority Data

Mar. 11, 2013 (KR) .......................... 10-2013-0025750

(51) Int. Cl.
*H01L 21/36* (2006.01)
*H01L 21/02* (2006.01)

(52) U.S. Cl.
CPC .... *H01L 21/02381* (2013.01); *H01L 21/02532* (2013.01); *H01L 21/02667* (2013.01)
USPC ........................................... 438/481; 438/486

(58) Field of Classification Search
CPC ................... H01L 21/02636; H01L 21/02639; H01L 21/02592
USPC .............................. 438/479–487; 257/E21.09
See application file for complete search history.

(56) References Cited

U.S. PATENT DOCUMENTS

| 8,629,045 | B2 * | 1/2014 | Cheng ........................... 438/481 |
| 2005/0054180 | A1 * | 3/2005 | Han et al. ....................... 438/479 |
| 2008/0085587 | A1 * | 4/2008 | Wells et al. .................... 438/455 |
| 2010/0025683 | A1 * | 2/2010 | Cheng .............................. 257/49 |
| 2010/0041214 | A1 * | 2/2010 | Cho et al. ...................... 438/481 |
| 2011/0065264 | A1 |  3/2011 | Moffatt et al. |

\* cited by examiner

*Primary Examiner* — Olik Chaudhuri
*Assistant Examiner* — Christine Enad
(74) *Attorney, Agent, or Firm* — Harness, Dickey & Pierce, P.L.C.

(57) ABSTRACT

A method of forming an epitaxial layer includes forming a plurality of first insulation patterns in a substrate, the plurality of first insulation patterns spaced apart from each other, forming first epitaxial patterns on the plurality of first insulation patterns, forming second insulation patterns between the plurality of first insulation patterns to contact the plurality of first insulation patterns, and forming second epitaxial patterns on the second insulation patterns and between the first epitaxial patterns to contact the first epitaxial patterns, the first epitaxial patterns and the second epitaxial patterns forming a single epitaxial layer.

20 Claims, 11 Drawing Sheets

METHODS OF FORMING EPITAXIAL LAYERS

CROSS-REFERENCE TO RELATED APPLICATION

This application claims the benefit of Korean Patent Application No. 10-2013-0025750, filed on Mar. 11, 2013, in the Korean Intellectual Property Office, the disclosure of which is incorporated herein in its entirety by reference.

BACKGROUND

1. Field

Some example embodiments of the inventive concepts relate to methods of forming epitaxial layers, for example, to methods of forming epitaxial layers on a substrate.

2. Description of the Related Art

In the electronics industry, optical interconnection techniques have been widely used to improve data transmission speed or a quantity of data transmitted for a unit time between electronic devices or optical devices, and that of each optical device in electronic systems. In such a case, it may be desirable to more readily form a single crystalline epitaxial layer on a substrate to transmit an optical signal.

SUMMARY

Some example embodiments of the inventive concepts provide methods of forming epitaxial layers on a substrate.

According to an example embodiment of the inventive concepts, a method of forming an epitaxial layer includes forming a plurality of first insulation patterns in a substrate, the plurality of first insulation patterns spaced apart from each other, forming first epitaxial patterns on the plurality of first insulation patterns, forming second insulation patterns between the plurality of first insulation patterns to contact the plurality of first insulation patterns, and forming second epitaxial patterns on the second insulation patterns and between the first epitaxial patterns to contact the first epitaxial patterns. The first epitaxial patterns and the second epitaxial patterns form a single epitaxial layer.

In an example embodiment, one of a width and a length of each of the plurality of first insulation patterns may be equal to or less than twice a maximum lateral growth length of each of the first epitaxial patterns during the forming first epitaxial patterns that employs the substrate between the plurality of first insulation patterns as a seed layer.

In an example embodiment, the first insulation patterns may be formed to have a distance between the plurality of first insulation patterns less than one of a width and a length of each of the plurality of first insulation patterns.

In an example embodiment, a sum of one of widths and lengths of the plurality of first insulation patterns and one of widths and lengths of the second insulation patterns may be within a range of several tens of micrometers (µm) to several hundreds of micrometers (µm), and one of a width and a length of the single epitaxial layer may be within a range of several tens of micrometers (µm) to several hundreds of micrometers (µm).

In an example embodiment, the plurality of first insulation patterns may be formed by etching the substrate to form a plurality of trenches in the substrate, the plurality of trenches spaced apart from each other, and forming a first insulation layer filling the plurality of trenches.

In an example embodiment, the first epitaxial patterns may be formed by forming a first amorphous source layer on the substrate and the plurality of first insulation patterns, and re-crystallizing the first amorphous source layer using an epitaxial growth process employing the substrate between the plurality of first insulation patterns as a seed layer.

In an example embodiment, the first amorphous source layer may be re-crystallized using one of a solid phase epitaxial technique and a liquid phase epitaxial technique.

In an example embodiment, the second insulation patterns may be formed by etching the substrate between the plurality of first insulation patterns to form trenches, and forming a second insulation layer filling the trenches.

In an example embodiment, the second epitaxial patterns may be formed by forming a second amorphous source layer on the second insulation patterns between the plurality of first insulation patterns, and re-crystallizing the second amorphous source layer using an epitaxial growth process employing the first epitaxial patterns as seed layers.

In an example embodiment, the second amorphous source layer may be formed by forming holes in the second insulation patterns between the first epitaxial patterns, forming an amorphous semiconductor layer on the first epitaxial patterns to fill the holes, and planarizing the amorphous semiconductor layer.

In an example embodiment, the method may further include forming an etch stop layer on one of the first epitaxial patterns and the substrate before forming the amorphous source layer.

In an example embodiment, the method may further include etching the plurality of first insulation patterns to form first recessed insulation patterns after forming the plurality of first insulation patterns, the first recessed insulation patterns having a top surface located at a lower level in a vertical direction than a top surface of the substrate.

According to another example embodiment of the inventive concepts, a method of forming an epitaxial layer includes forming a plurality of first trenches spaced apart from each other in a substrate, forming first insulation patterns in the plurality of first trenches, forming an epitaxial layer on the first insulation patterns using the substrate as a seed layer, etching the epitaxial layer and the substrate to form second trenches between the first insulation patterns and to form first epitaxial patterns on the first insulation patterns, forming second insulation patterns filling the second trenches and contacting the first insulation patterns, and forming second epitaxial patterns on the second insulation patterns and between the first epitaxial patterns to contact the first epitaxial patterns. The second epitaxial patterns are formed using the first epitaxial patterns as seed layers.

In another example embodiment, forming the epitaxial layer may include forming an amorphous source layer on the substrate and the first insulation patterns, and re-crystallizing the amorphous source layer on the first insulation patterns using the substrate between the first insulation patterns as a seed layer.

In another example embodiment, the method may further include etching the first insulation patterns to form first recessed insulation patterns after forming the first insulation patterns, the first recessed insulation patterns having a top surface located at a lower level than a top surface of the substrate.

In another example embodiment, the second insulation patterns may be formed by etching the second insulation patterns to form second recessed insulation patterns, the second recessed insulation patterns having a top surface located at a lower level in a vertical direction than a top surface of the substrate, the epitaxial layer and the substrate may be etched to form first epitaxial patterns having a bottom surface located at a lower level in a vertical direction than a top surface of the substrate, and the second epitaxial patterns may be formed having a bottom surface located at a lower level in a vertical direction than a top surface of the substrate.

According to yet another example embodiment, a method of forming an epitaxial layer includes forming first insulation patterns in a substrate, forming first epitaxial patterns on the first insulation patterns, forming second insulation patterns between the first insulation patterns, the first and second insulation patterns forming an insulation layer, and forming second epitaxial patterns on the second insulation patterns and between the first epitaxial patterns, the first and second epitaxial patterns forming a single epitaxial layer covering the insulation layer.

In yet another example embodiment, the first epitaxial patterns may be formed by forming a first amorphous source layer on the substrate and the first insulation patterns, and re-crystallizing the first amorphous source layer using an epitaxial growth process employing the substrate between the first insulation patterns as a seed layer.

In yet another example embodiment, the second epitaxial patterns may be formed by forming a second amorphous source layer on the second insulation patterns between the first insulation patterns, and re-crystallizing the second amorphous source layer using an epitaxial growth process employing the first epitaxial patterns as seed layers.

In yet another example embodiment, the method may further include etching the first insulation patterns to form first recessed insulation patterns after forming the first insulation patterns, the first recessed insulation patterns having a top surface located at a lower level in a vertical direction than a top surface of the substrate.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Various embodiments will now be described more fully hereinafter with reference to the accompanying drawings. In the drawings, the same reference numerals or the same reference designators denote the same elements. Accordingly, descriptions to the same elements as set forth previously will be omitted or briefly mentioned to avoid duplicate explanation.

Example embodiments of the inventive concepts may be embodied in different forms and should not be construed as limited to the embodiments set forth herein. Rather, these embodiments are provided so that this disclosure will be thorough and complete, and will fully convey the scope of the inventive concepts to those skilled in the art.

Although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Moreover, in method embodiments such as fabrication method embodiments, process steps of the methods may be performed in different sequences from the order which is described in the specification unless the context clearly indicates otherwise. That is, the process steps of the methods may be performed in the same sequence as described in the specification or in an opposite sequence thereto.

The inventive concepts will be described with reference to cross-sectional illustrations, which are schematic illustrations of idealized embodiments. As such, variations from the shapes of the illustrations, as a result, for example, of manufacturing techniques and/or tolerances, are to be expected. Thus, the embodiments should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the inventive concepts.

Figure 1:
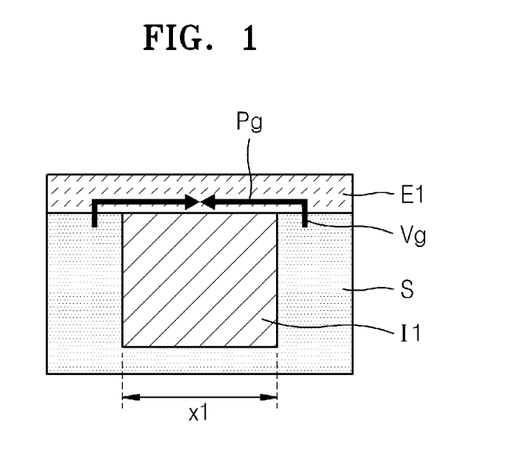
FIGS. 1 and 2 are cross sectional views illustrating a method of forming an epitaxial layer according to some example embodiments of the inventive concepts.
Figure 2:
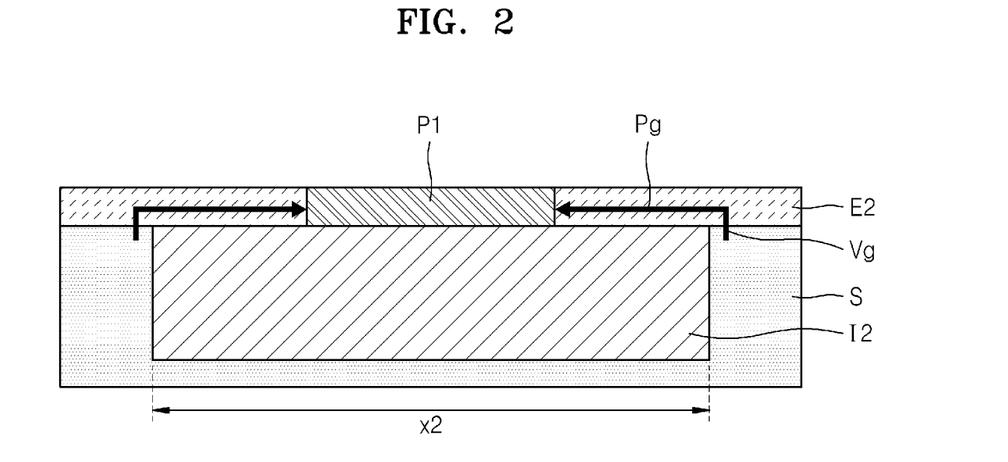

FIGS. 1 and 2 are cross sectional views illustrating a method of forming an epitaxial layer according to some example embodiments of the inventive concepts.

Specifically, as illustrated in FIGS. 1 and 2, it may be desirable to readily form an epitaxial layer E1 (or E2) on a substrate S and an insulation layer I1 (or I2) disposed in the substrate S to transmit an optical signal used in an optical device or an electronic device without loss of optical energy. The optical device may be an optical passive device. For example, the optical device may be an optical coupler, an optical waveguide device, and/or a wavelength division multiplexer (WDM). The electronic device may be a memory chip (e.g., a memory device), a non-memory chip (e.g., a non-memory device) or a central processing unit (CPU). The substrate S may be a single crystalline substrate, for example, a single crystalline bulk silicon substrate. Each of the epitaxial layers E1 and E2 may be a single crystalline semiconductor substrate, a homogeneous semiconductor layer or a heterogeneous semiconductor layer. For example, each of the epitaxial layers E1 and E2 may be a single crystalline silicon layer or a single crystalline germanium layer. Each of the insulation layers and I1 and I2 may be a silicon oxide layer.

The epitaxial layer E1 or E2 may be formed by depositing an amorphous source layer (not shown) on the substrate S and by growing the amorphous source layer in a vertical direction Vg and a horizontal direction Pg illustrated in FIG. 1 or 2 using an epitaxial growth process that employs the substrate S (i.e., a surface layer of the substrate S) as a seed layer. The epitaxial growth process for vertically and horizontally growing the amorphous source layer may be performed using a solid phase epitaxial (SPE) technique or a liquid phase epitaxial (LPE) technique.

In FIG. 1, a dimension X1 corresponding to a width or a length of the insulation layer I1 may be a few micrometers (μm). The dimension X1 may correspond to a numerical value which is equal to or less than twice a maximum lateral growth length (or width) of the epitaxial layer E1 when the epitaxial layer E1 is formed by growing the amorphous source layer using an epitaxial growth process that employs the substrate S as a seed layer. The term "maximum lateral growth length (or width)" may be defined as the greatest extent to which the epitaxial layer E1 may grow in a lateral direction. That is, the epitaxial layer E1 may be formed on the insulation layer I1 to have a width or a length of a few micrometers (μm), as illustrated in the cross sectional view of FIG. 1. Thus, the epitaxial layer E1 may be formed to have a relatively small planar area on the insulation layer I1 even when viewed from a plan view.

In contrast, a dimension X2 corresponding to a width or a length of the insulation layer I2 of FIG. 2 may be greater than the dimension X1 which is within the range of several tens of micrometers (μm) to several hundreds of micrometers (μm). That is, the dimension X2 may correspond to a numerical value which is greater than twice a maximum lateral growth length (or width) of the epitaxial layer E2 when the epitaxial layer E2 is formed by growing the amorphous source layer using an epitaxial growth process that employs the substrate S as a seed layer. Thus, a polycrystalline semiconductor layer P1 in addition to the epitaxial layer E2 may also be formed on the insulation layer I2 of FIG. 2. The polycrystalline semiconductor layer P1 may be a polycrystalline silicon layer or a polycrystalline germanium layer. If the polycrystalline semiconductor layer P1 is formed on the insulation layer I2, the polycrystalline semiconductor layer P1 may cause optical loss.

In order to realize an optical device or an electronic device on the substrate S, a single crystalline epitaxial layer may be uniformly formed on the insulation layer I2 having the dimension X2 corresponding to a width or a length thereof in order to minimize or reduce optical loss. That is, a single crystalline epitaxial layer may be uniformly formed on an entire surface of the insulation layer I2 to have a width or a length of several tens of micrometers (μm) to several hundreds of micrometers (μm) when viewed from a cross sectional view. The single crystalline epitaxial layer having a relatively large planar area may be formed to fully cover the insulation layer I2 even when viewed from a plan view.

FIGS. 3 to 13 are cross sectional views illustrating a method of forming an epitaxial layer according to an example embodiment of the inventive concepts.

Figure 3:
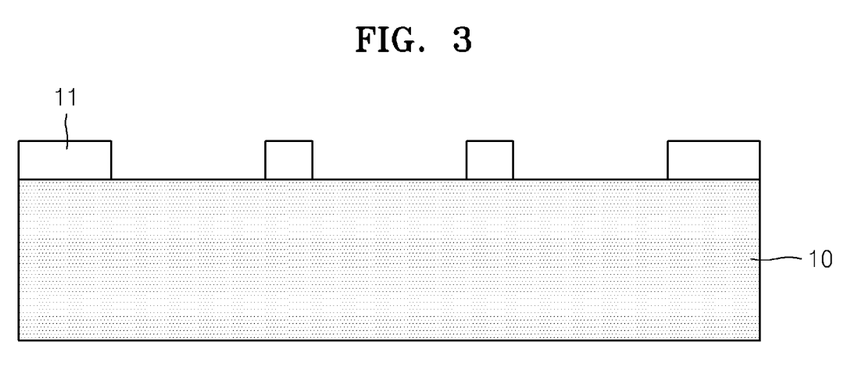
FIGS. 3 to 13 are cross sectional views illustrating a method of forming an epitaxial layer according to an example embodiment of the inventive concepts.
Figure 4:
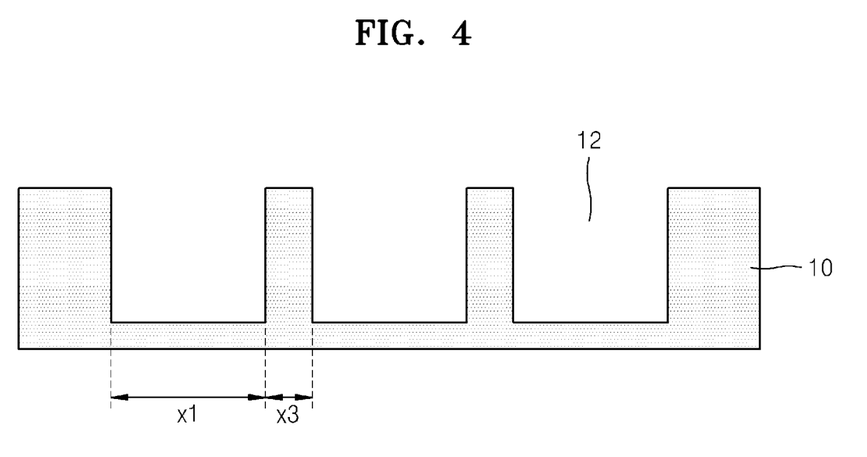

Referring to FIGS. 3 and 4, a substrate 10 may be provided as illustrated in FIG. 3. The substrate 10 may be a single crystalline semiconductor substrate. For example, the substrate 10 may be a single crystalline bulk silicon substrate. The substrate 10 may correspond to the substrate S illustrated in FIG. 1 or 2. A mask pattern 11 may be formed on a surface of the substrate 10. The mask pattern 11 may be a photoresist pattern or an insulation material pattern.

Subsequently, the substrate 10 may be etched using the mask pattern 11 as an etch mask to form a plurality of first trenches 12 which are spaced apart from each other in the substrate 10. Each of the first trenches 12 may be formed to have a width (or a length) X1 which is substantially equal to the dimension X1 of the insulation layer I1 illustrated in FIG. 1. The width (or length) X1 of each first trench 12 may correspond to a width (or a length) of a first insulation pattern 16 which is formed in a subsequent process. A distance X3 between the first trenches 12 may be a few micrometers (μm). The distance X3 between the first trenches 12 may be less than the width (or length) X1 of each first trench 12.

Figure 5:
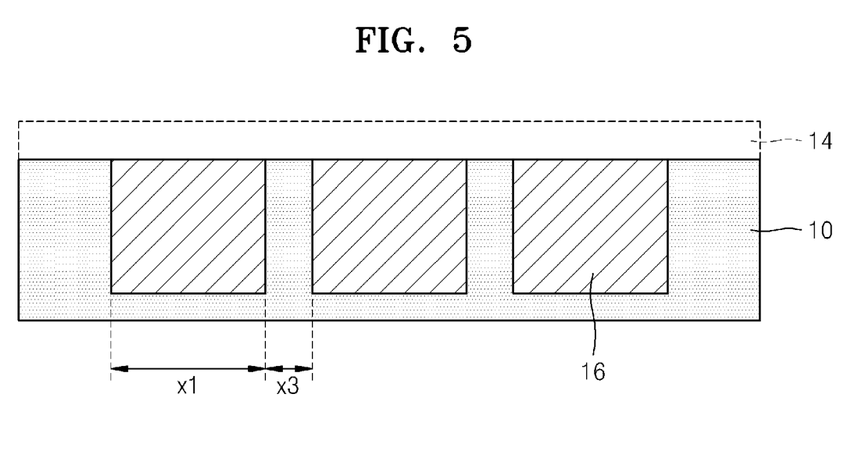

Referring to FIG. 5, after removal of the mask pattern 11, a first insulation layer 14 may be formed on an entire surface of the substrate 10 to fill the first trenches 12. The first insulation layer 14 may be formed of a silicon oxide layer.

Subsequently, the first insulation layer 14 may be planarized using the substrate 10 as an etch stop layer. The planarization of the first insulation layer 14 may be performed using a chemical mechanical polishing (CMP) process. As a result, a plurality of first insulation patterns 16, which are spaced apart from each other, may be formed in respective ones of the first trenches 12. Accordingly, a width (or a length) of each of the first insulation patterns 16 may correspond to the width (or the length) X1 of each of the first trenches 12. The width (or a length) X1 of each of the first insulation patterns 16 may be equal to or less than twice a maximum lateral growth length (or width) of a single crystalline epitaxial layer when the single crystalline epitaxial layer is formed using an epitaxial growth process that employs the substrate 10 between the first insulation patterns 16 as a seed layer.

Figure 6:
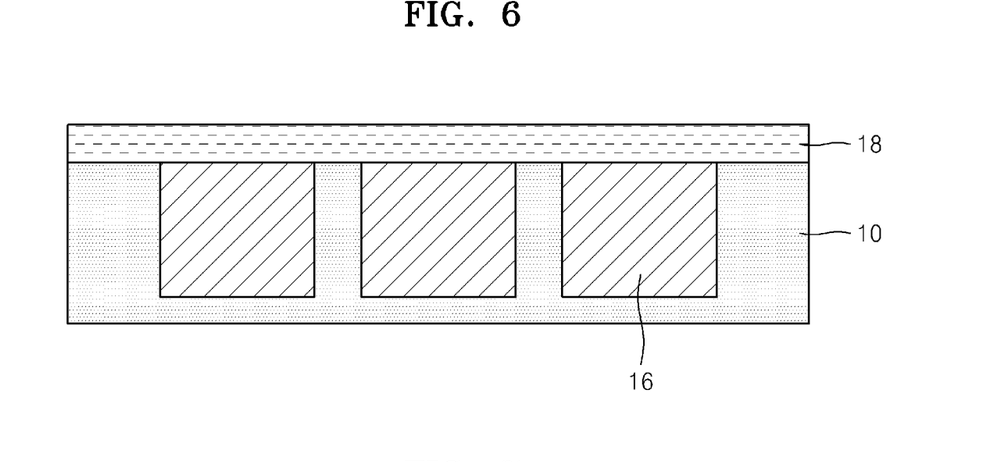
Figure 7:
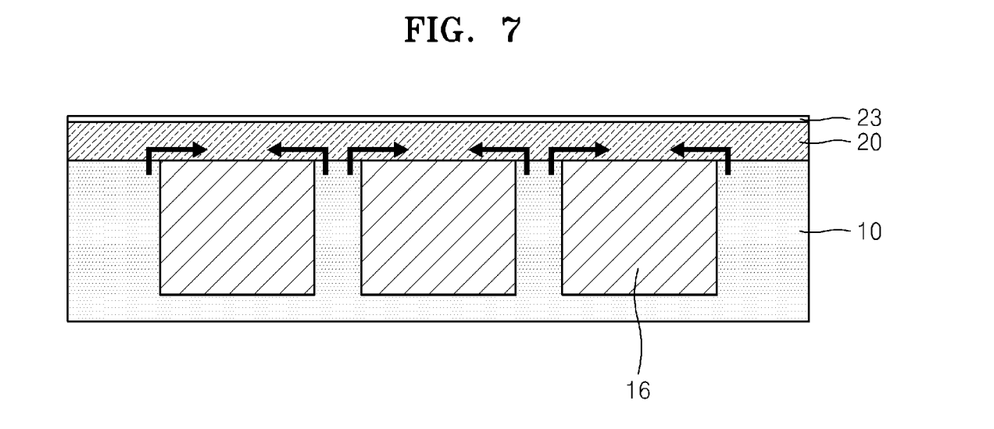

Referring to FIGS. 6 and 7, a first amorphous source layer 18 may be formed on the substrate 10 and the first insulation patterns 16 (see FIG. 6). The first amorphous source layer 18 may be formed of an amorphous semiconductor layer, for example, an amorphous silicon layer or an amorphous germanium layer.

Subsequently, the first amorphous source layer 18 may be re-crystallized using an epitaxial growth process that employs the substrate 10 between the first insulation patterns 16 as a seed layer, thereby forming a first single crystalline epitaxial layer 20 (see FIG. 7). The first epitaxial layer 20 may be a homogeneous semiconductor layer or a heterogeneous semiconductor layer that has the same crystalline state as the substrate 10 which is used as a seed layer. For example, when the substrate 10 is a single crystalline silicon substrate, the first epitaxial layer 20 may be a single crystalline silicon layer (i.e., a homogeneous semiconductor layer) or a single crystalline germanium layer (i.e., a heterogeneous semiconductor layer).

As described with reference to FIGS. 1 and 2, the first single crystalline epitaxial layer 20 may be formed by vertically and laterally growing the first amorphous source layer 18 using an epitaxial growth process that employs the substrate 10 as a seed layer. The epitaxial growth process used in growth of the first amorphous source layer 18 may be performed using a solid phase epitaxial (SPE) technique or a liquid phase epitaxial (LPE) technique.

In the event that the first amorphous source layer 18 is grown using a solid phase epitaxial (SPE) technique, the first amorphous source layer 18 may be melted and re-crystallized by annealing the substrate 10 including the first amorphous source layer 18 at a temperature of approximately 500 degrees Celsius to approximately 600 degrees Celsius for a relatively long time, for example, for approximately 10 hours to approximately 20 hours to form the first single crystalline epitaxial layer 20. In the event that the first amorphous source layer 18 is grown using a liquid phase epitaxial (LPE) technique, the first amorphous source layer 18 may be melted and re-crystallized by applying heat energy to the first amorphous source layer 18 using a rapid thermal process (RTP), a rapid thermal annealing (RTA) process or a laser irradiation process to form the first single crystalline epitaxial layer 20.

An etch stop layer 23 may then be formed on the first epitaxial layer 20. The etch stop layer 23 may be formed to improve a flatness uniformity during a subsequent planarization process. The etch stop layer 23 may be formed of a silicon nitride (SiN) layer, a silicon carbon nitride (SiCN) layer, an SiOCN layer, an SiOBN layer or an SiOPN layer.

Figure 8:
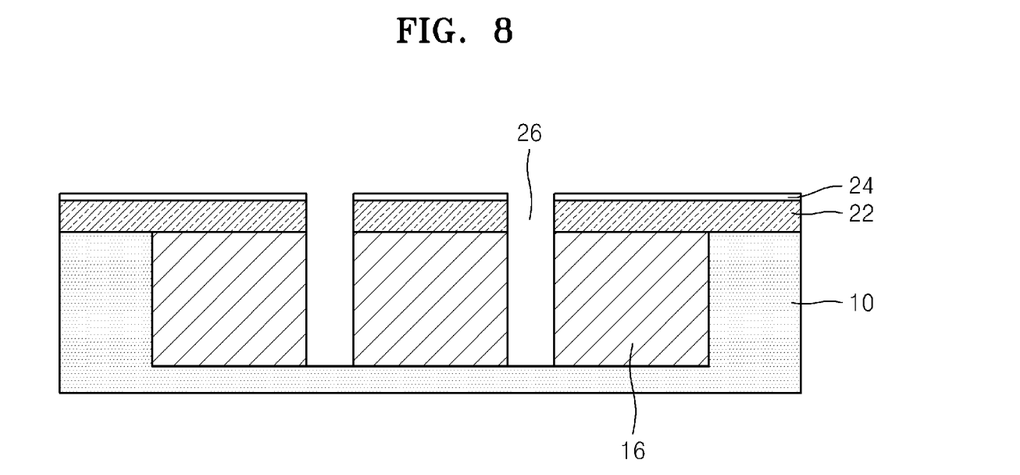

Referring to FIG. 8, the etch stop layer 23, the first epitaxial layer 20 and the substrate 10 may be etched to form second trenches 26 located between the first insulation patterns 16. The etch stop layer 23, the first epitaxial layer 20 and the substrate 10 may be etched such that bottom surfaces of the second trenches 26 are located at substantially the same level as bottom surfaces of the first trenches 12. As a result, a first epitaxial pattern 22 and an etch stop pattern 24 may be sequentially stacked on each of the first insulation patterns 16.

Figure 9:
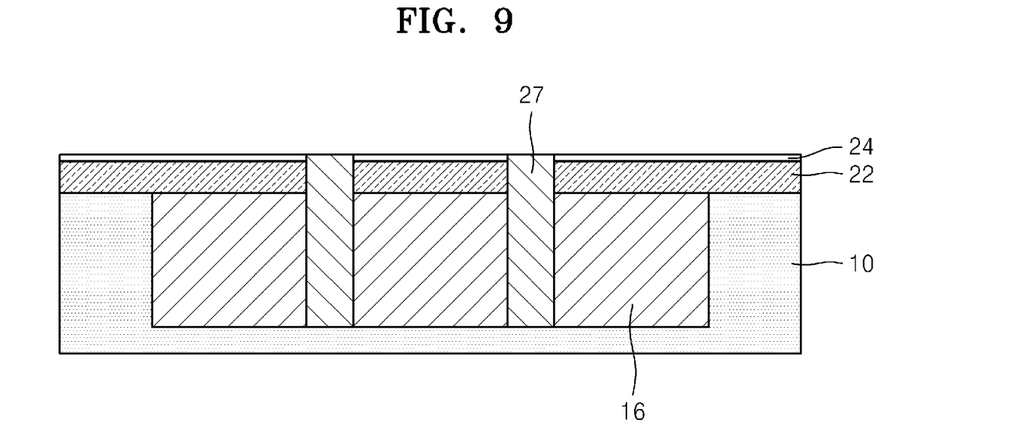
Figure 10:
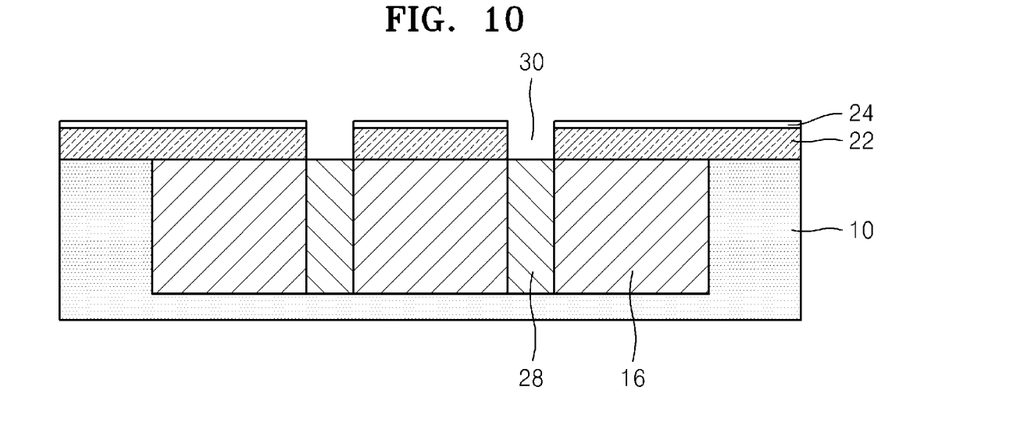

Referring to FIGS. 9 and 10, second insulation patterns 27 may be formed in respective ones of the second trenches 26 (see FIG. 9). The second insulation patterns 27 may be formed of a silicon oxide layer. Specifically, the second insulation patterns 27 may be formed by depositing a silicon oxide layer on the etch stop patterns 24 to fully fill the second trenches 26 and by planarizing the silicon oxide layer using the etch stop patterns 24 as planarization stoppers.

Subsequently, the second insulation patterns 27 may be etched to form holes 30 between the first epitaxial patterns 22 (see FIG. 10). As a result, second recessed insulation patterns 28 may be formed between the first insulation patterns 16, and the second recessed insulation patterns 28 may contact the first insulation patterns 16.

Figure 11:
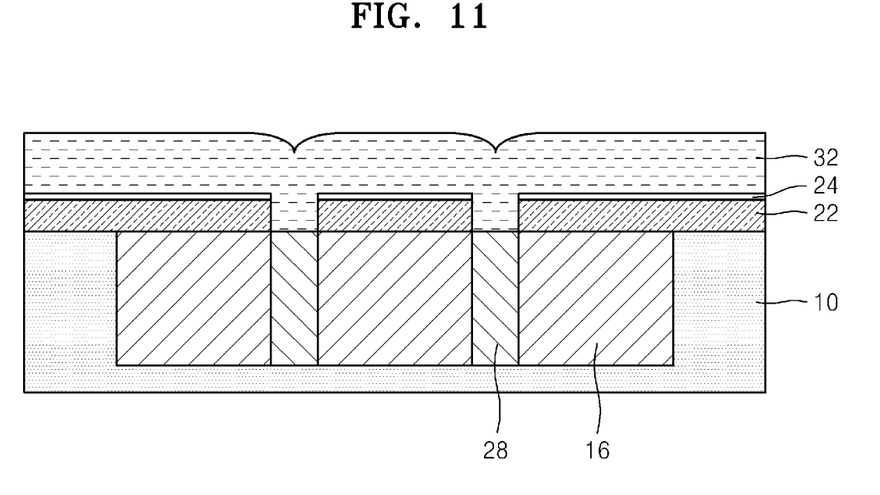

Referring to FIG. 11, a second amorphous source layer 32 may be formed on the etch stop patterns 24 to fill the holes 30. That is, the second amorphous source layer 32 may be formed to cover the second recessed insulation patterns 28. The second amorphous source layer 32 may be formed of the same material layer as the first amorphous source layer 18.

Figure 12:
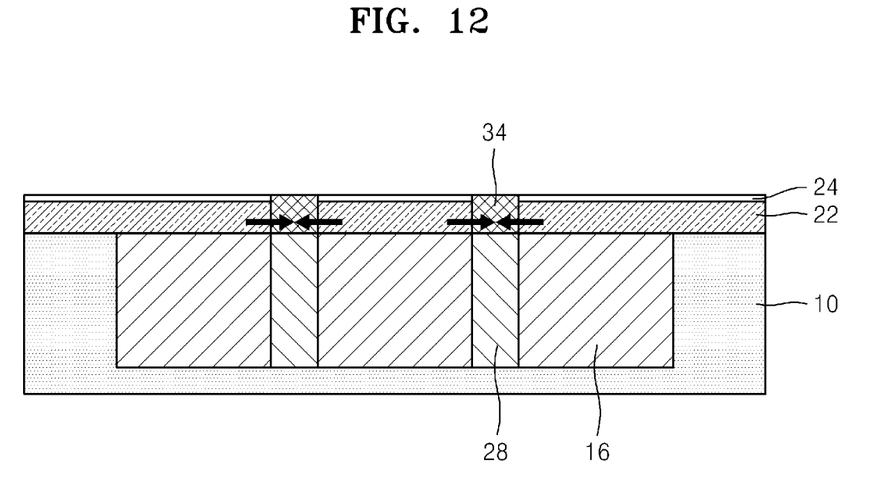

Referring to FIG. 12, the second amorphous source layer 32 may be partially re-crystallized using an epitaxial growth process that employs the first epitaxial patterns 22 as seed layers, thereby forming second epitaxial patterns 34 located between the first epitaxial patterns 22. The second epitaxial patterns 34 may be formed by laterally growing the second amorphous source layer 32, as indicated by arrows, using an epitaxial growth process that employs the first epitaxial patterns 22 as seed layers. The second epitaxial patterns 34 may be formed to have the same material as the first epitaxial patterns 22. That is, no discontinuous regions may exist at boundary regions between the first epitaxial patterns 22 and the second epitaxial patterns 34 in crystallography.

The second epitaxial patterns 34 may be formed by re-crystallizing the second amorphous source layer 32 using an epitaxial growth process to form a single crystalline epitaxial layer (not shown) and by planarizing or etching back the single crystalline epitaxial layer until the etch stop patterns 24 are exposed. The epitaxial growth process used in formation of the second epitaxial patterns 34 may be substantially the same process as the epitaxial growth process used in formation of the first epitaxial layer 20. Thus, a detailed description to the epitaxial growth process used in formation of the second epitaxial patterns 34 will be omitted to avoid duplicate explanation. The second epitaxial patterns 34 may be formed on respective ones of the second recessed insulation patterns 28 between the first insulation patterns 16 and may be formed to contact the first epitaxial patterns 22 stacked on the first insulation patterns 16.

Figure 13:
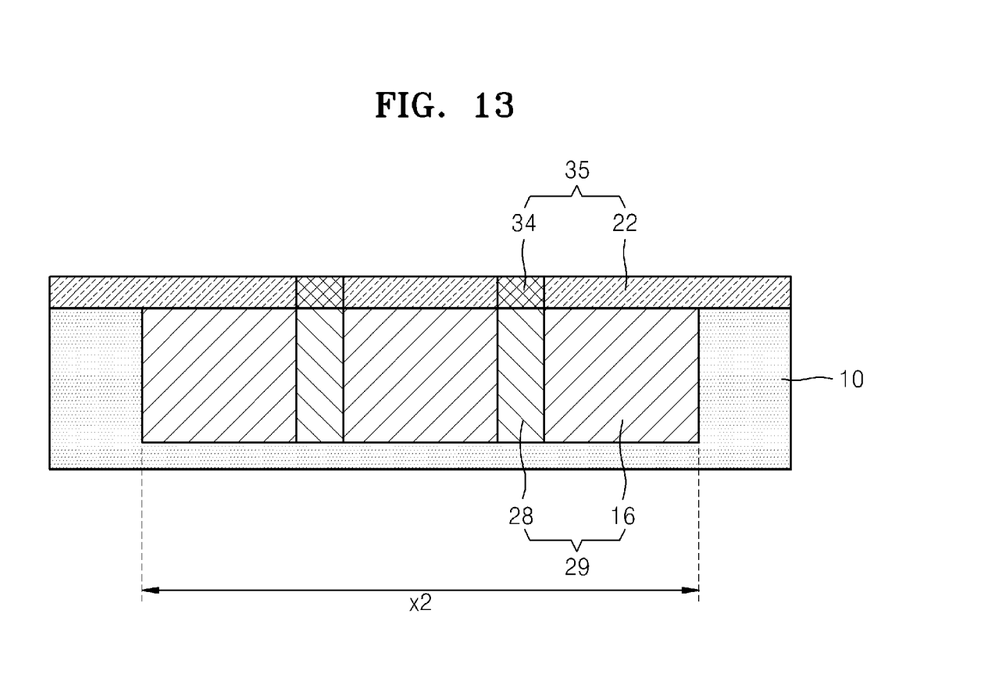

Referring to FIG. 13, the etch stop patterns 24 may be removed to expose the first epitaxial patterns 22. The first insulation patterns 16 and the second recessed insulation patterns 28 may constitute an insulation layer 29, and the insulation layer 29 may be covered with a single epitaxial layer 35 including the first and second epitaxial patterns 22 and 34.

A width (or a length) of the insulation layer 29 may correspond to the width (or the length) X2 of the insulation layer I2 illustrated of FIG. 2. The single epitaxial layer 35 may be uniformly formed on the insulation layer 29 having a width (or a length) X2. Because the single epitaxial layer 35 is uniformly formed on the insulation layer 29 having a width (or a length) X2, the single epitaxial layer 35 may be formed on the insulation layer 29 to have a relatively large planar area even when viewed from a plan view.

According to the embodiment as set forth above, first epitaxial patterns 22 may be formed on respective ones of first insulation patterns 16 disposed in a substrate 10 using an epitaxial growth process that employs the substrate 10 between the first insulation patterns 16 as a seed layer, second recessed insulation patterns 28 may be formed in the substrate 10 between the first insulation patterns 16, and second epitaxial patterns 34 may be formed in respective ones of holes 30 between the first epitaxial patterns 22 using an epitaxial growth process that employs the first epitaxial patterns 22 as seed layers. As such, a single epitaxial layer 35 including the first and second epitaxial patterns 22 and 34 may be uniformly formed on an insulation layer including the first and second insulation patterns 16 and 28 to have a relatively large planar area.

FIGS. 14 to 23 are cross sectional views illustrating a method of forming an epitaxial layer according to another example embodiment of the inventive concepts.

The method illustrated in FIGS. 14 to 23 may be substantially the same as described with reference to FIGS. 3 to 13 except that first insulation patterns are recessed to have top surfaces which are located at a lower level than a top surface of a substrate.

Figure 14:
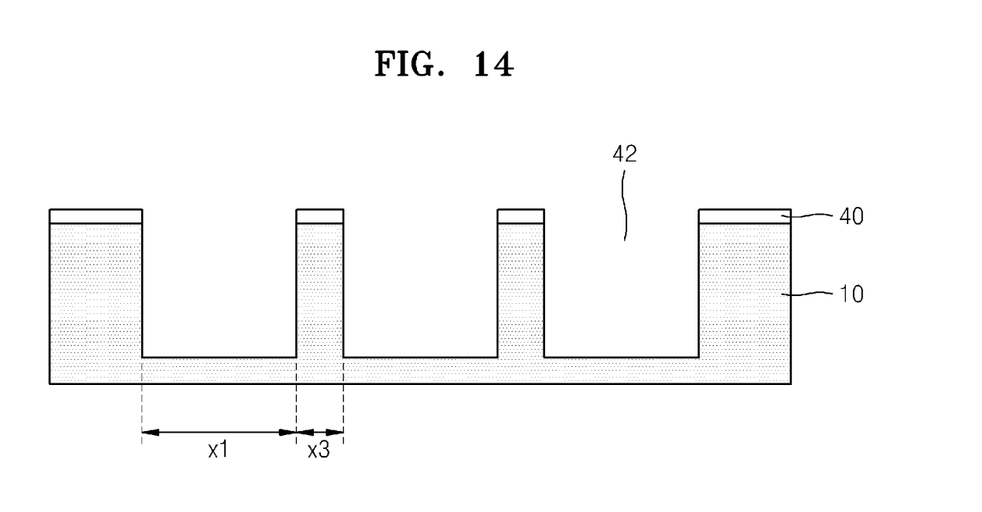
FIGS. 14 to 23 are cross sectional views illustrating a method of forming an epitaxial layer according to another example embodiment of the inventive concepts.

Referring to FIG. 14, etch stop patterns 40 may be formed on a substrate 10. The substrate 10 may be etched using the etch stop patterns 40 as etch masks to form a plurality of first trenches 42, which are spaced apart from each other, in the substrate 10.

The substrate 10 may be the same substrate as described in the previous embodiment illustrated in FIGS. 3 to 13. The etch stop patterns 40 may be formed of the same material as the etch stop patterns 24 described in the previous embodiment. A width (or a length) X1 of each of the first trenches 42 may be equal to the width (or the length) X1 of the insulation layer I1 illustrated in FIG. 1. Alternatively, a distance between the first trenches 42 may be equal to the distance X3 shown in FIG. 4 and may be less than the width (or a length) X1 of each of the first trenches 42.

Figure 15:
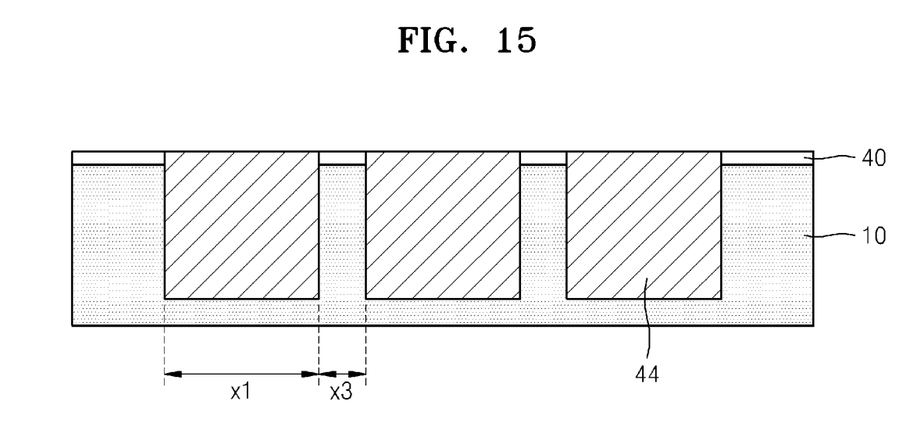

Referring to FIG. 15, a plurality of first insulation patterns 44, which are spaced apart from each other, may be formed in respective ones of the first trenches 42. The first insulation patterns 44 may be formed by depositing a first insulation layer (not shown) on an entire surface of the substrate 10 including the first trenches 42 and by planarizing the first insulation layer using the etch stop patterns 40 as planarization stoppers. In some embodiments, the first insulation layer may be formed of a silicon oxide layer, and the planarization of the first insulation layer may be performed using a chemical mechanical polishing (CMP) process. A width (or a length) of each of the first insulation patterns 44 may be equal to the width (or a length) X1 of each of the first trenches 42.

Figure 16:
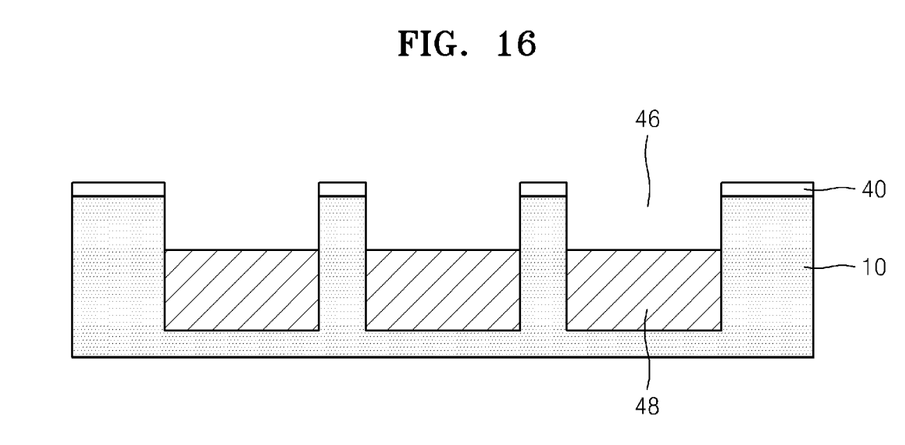

Referring to FIG. 16, the first insulation patterns 44 may be etched to form recessed holes 46 whose bottom surfaces are located at a lower level than a top surface of the substrate 10. In such a case, if first epitaxial patterns are formed in respective ones of the recessed holes 46 in a subsequent process, optical loss may be reduced. As a result of formation of the recessed holes 46, first recessed insulation patterns 48 may be formed in respective ones of the first trenches 42.

Figure 17:
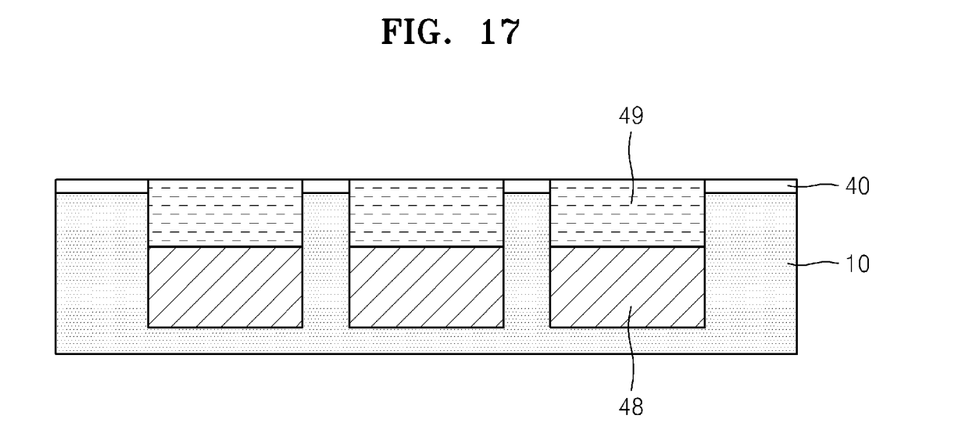

Referring to FIG. 17, first amorphous source patterns 49 may be formed in respective ones of the recessed holes 46. The first amorphous source patterns 49 may be formed of the same material as the first amorphous source layer 18 illustrated in FIG. 6. The first amorphous source patterns 49 may be formed by depositing an amorphous source layer to completely fill the recessed holes 46 and by planarizing the amorphous source layer.

Figure 18:
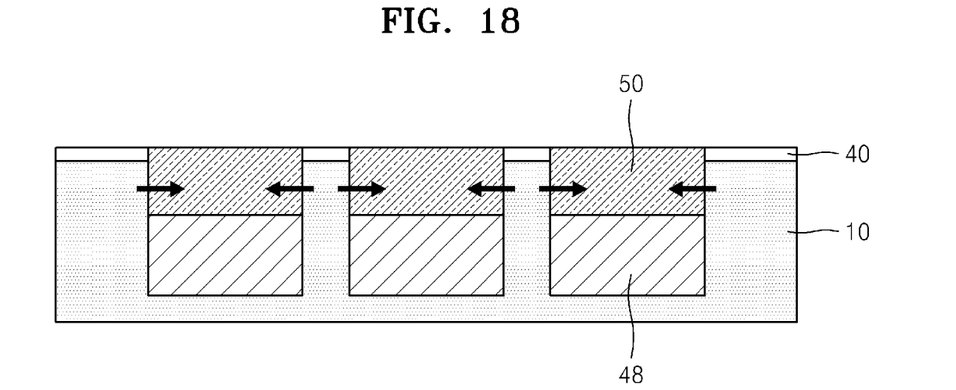

Referring to FIG. 18, the first amorphous source patterns 49 may be re-crystallized using an epitaxial growth process that employs the substrate 10 between the first recessed insulation patterns 48 as a seed layer, thereby forming first epitaxial patterns 50 on respective ones of the first recessed insulation patterns 48. The first epitaxial patterns 50 may be formed by a lateral epitaxial growth of the first amorphous source patterns 49 during the epitaxial growth process employing the substrate 10 between the first recessed insulation patterns 48 as a seed layer, as indicated by arrows in FIG. 18. The epitaxial growth process used in formation of the first epitaxial patterns 50 may be substantially the same process as the epitaxial growth processes described in the previous embodiment. Thus, a detailed description to the epitaxial growth process used in formation of the first epitaxial patterns 50 will be omitted to avoid duplicate explanation. The first epitaxial patterns 50 may be formed of the same material as the first epitaxial layer 20 of FIG. 7 (i.e., the first epitaxial patterns 22 of FIG. 8).

Figure 19:
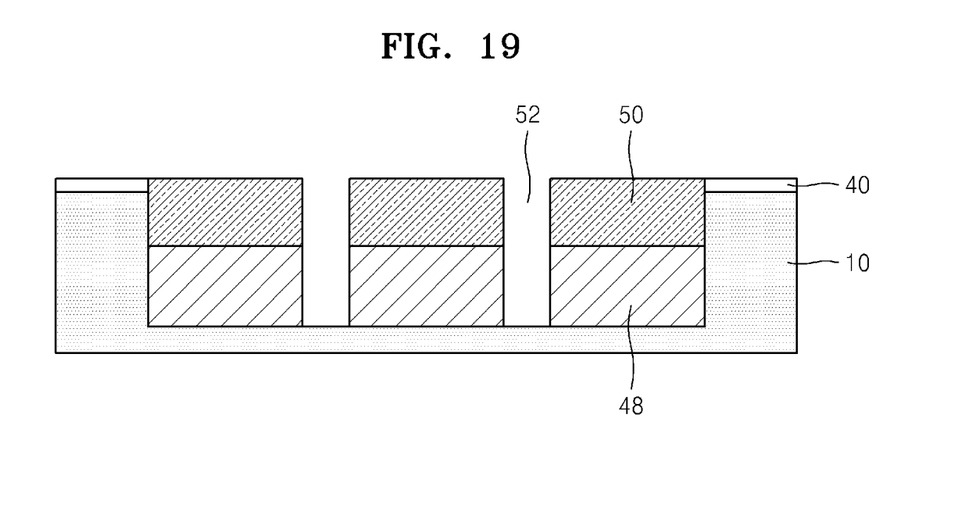
Figure 20:
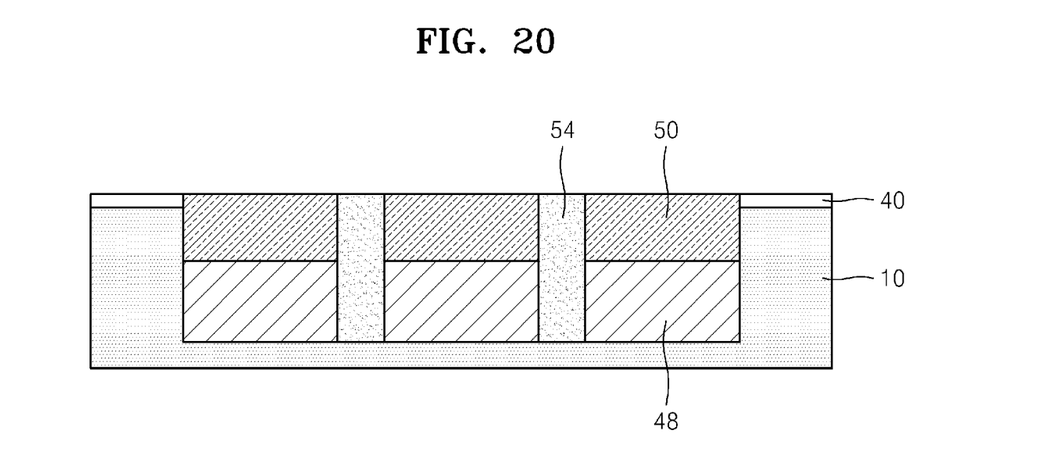

Referring to FIGS. 19 and 20, the etch stop patterns 40 and the substrate 10 may be etched to form second trenches 52 positioned between the first recessed insulation patterns 48 (see FIG. 19). The etch stop patterns 40 and the substrate 10 may be etched such that bottom surfaces of the second trenches 52 are located at substantially the same level as bottom surfaces of the first trenches 42.

Subsequently, second insulation patterns 54 may be formed in respective ones of the second trenches 52 (see FIG. 20). The second insulation patterns 54 may be formed of a silicon oxide layer. The second insulation patterns 54 may be formed by depositing a silicon oxide layer on the etch stop patterns 40 and the first epitaxial patterns 50 to fill the second trenches 52 and by planarizing the silicon oxide layer using the etch stop patterns 24 as planarization stoppers.

Figure 21:
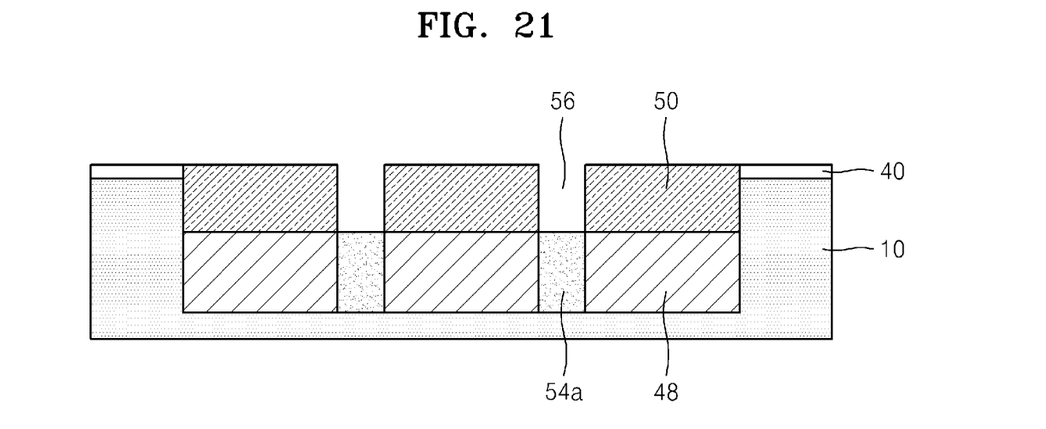

Referring to FIG. 21, the second insulation patterns 54 may be etched to form holes 56 between the first epitaxial patterns 50. As a result, second recessed insulation patterns 54a contacting the first recessed insulation patterns 48 may be formed between the first recessed insulation patterns 48.

Figure 22:
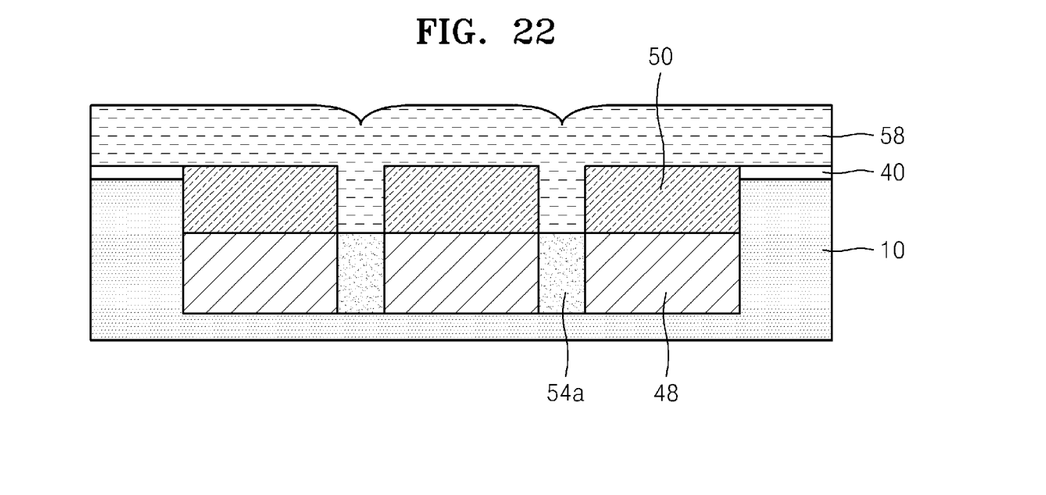

Referring to FIG. 22, a second amorphous source layer 58 may be formed on the first epitaxial patterns 50 and the etch stop patterns 40 to fill the holes 56. That is, the second amorphous source layer 58 may be formed to cover the second recessed insulation patterns 54a. The second amorphous source layer 58 may be formed of the same material layer as the first amorphous source patterns 49.

Figure 23:
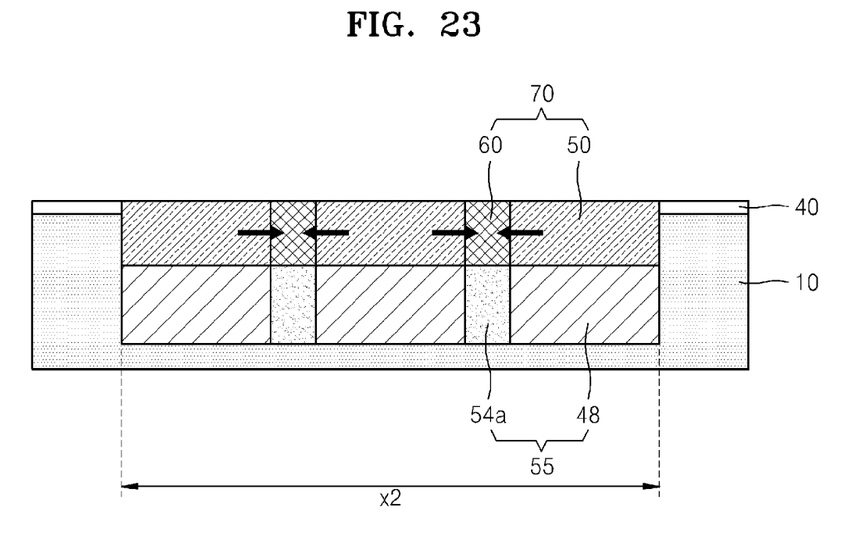

Referring to FIG. 23, the second amorphous source layer 58 may be partially re-crystallized using an epitaxial growth process that employs the first epitaxial patterns 50 as seed layers, thereby forming second epitaxial patterns 60 located between the first epitaxial patterns 50. The second epitaxial patterns 60 may be formed by a lateral epitaxial growth of the second amorphous source layer 58 during the epitaxial growth process employing the first epitaxial patterns 50 as seed layers, as indicated by arrows in FIG. 23. The second epitaxial patterns 60 may be formed to have the same material as the first epitaxial patterns 50. That is, no discontinuous regions may exist at boundary regions between the first epitaxial patterns 50 and the second epitaxial patterns 60 in crystallography.

The second epitaxial patterns 60 may be formed by partially re-crystallizing the second amorphous source layer 58 using an epitaxial growth process to form a single crystalline epitaxial layer (not shown) and by planarizing or etching back the single crystalline epitaxial layer until the etch stop patterns 40 are exposed. The epitaxial growth process used in formation of the second epitaxial patterns 60 may be substantially the same process as the epitaxial growth process described above. Thus, a detailed description to the epitaxial growth process used in formation of the second epitaxial patterns 60 will be omitted to avoid duplicate explanation. The second epitaxial patterns 60 may be formed on respective ones of the second recessed insulation patterns 54a between the first recessed insulation patterns 48 and may be formed to contact the first epitaxial patterns 50 stacked on the first recessed insulation patterns 48.

The first recessed insulation patterns 48 and the second recessed insulation patterns 54a may constitute an insulation layer 55, and the insulation layer 55 may be covered with a single epitaxial layer 70 including the first and second epitaxial patterns 50 and 60. A width (or a length) of the insulation layer 55 may correspond to the width (or the length) X2 of the insulation layer 12 illustrated of FIG. 2. Therefore, the single epitaxial layer 70 may be uniformly formed on the insulation layer 55 having a width (or a length) X2. Because the single epitaxial layer 70 is uniformly formed on the insulation layer 55 having a width (or a length) X2, the single epitaxial layer 70 may be formed on the insulation layer 55 to have a relatively large planar area even when viewed from a plan view.

Figure 24:
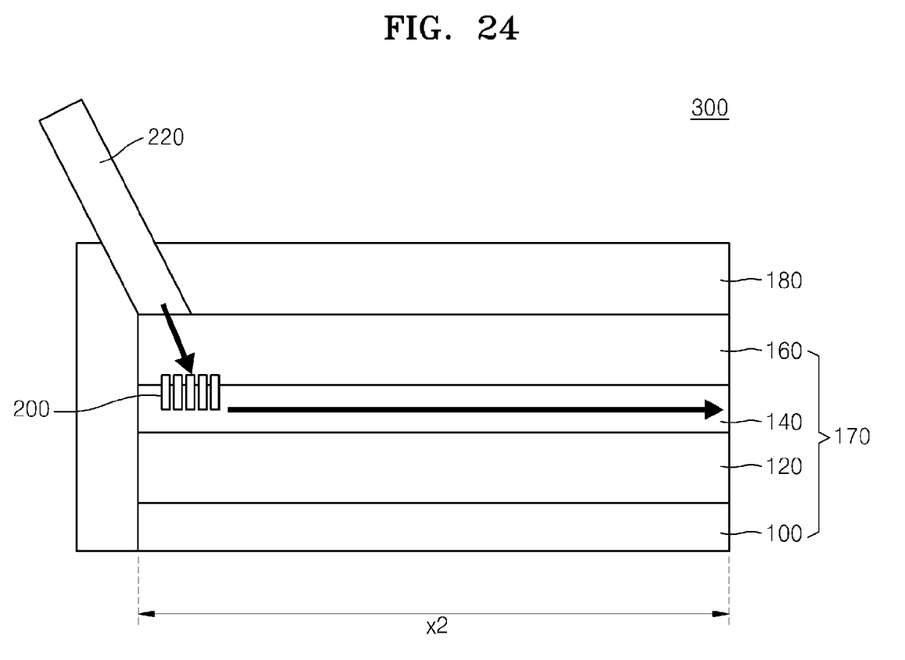
FIG. 24 is a cross sectional view illustrating an optical device package including an optical device fabricated using a method of forming an epitaxial layer according to some example embodiments of the inventive concepts.

FIG. 24 is a cross sectional view illustrating an optical device package including an optical device fabricated using a method of forming an epitaxial layer according to some example embodiments of the inventive concepts.

Specifically, an optical device package 300 may include an optical device 170, a protection member 180, an optical coupler 200 and an optical fiber 220. The protection member 180 may be disposed to surround the optical device 170, and the optical fiber 220 may penetrate the protection member 180 to be adjacent to the optical coupler 200 in the optical device 170. The optical device 170 may include a substrate 100, a lower cladding layer 120, an optical waveguide 140 and an upper cladding layer 160. The lower cladding layer 120, the optical waveguide 140 and the upper cladding layer 160 may be sequentially stacked on the substrate 100. The lower cladding layer 120 and the upper cladding layer 160 may be disposed on a bottom surface and a top surface of the optical waveguide 140 respectively, thereby improving the optical transmission efficiency of the optical waveguide 140. The substrate 100 may be a single crystalline semiconductor substrate, for example, a single crystalline silicon substrate.

The lower cladding layer 120 may be an insulation layer, for example, a silicon oxide layer. The optical waveguide 140 may correspond to the single epitaxial layer described in the aforementioned embodiments. Each of the lower cladding layer 120 and the optical waveguide 140 may have a width (or a length) X2 of several tens of micrometers ($\mu$m) to several hundreds of micrometers ($\mu$m). The upper cladding layer 160 may include the same material as lower cladding layer 120.

An optical signal introduced into the optical fiber 220 may travel along the optical waveguide 140 through the optical coupler 200, as indicated by arrows. As a result, since the optical signal travels along the long and single crystalline optical waveguide 140 having the length X2 of several tens of micrometers ($\mu$m) to several hundreds of micrometers ($\mu$m), the optical loss in the optical waveguide 140 may be reduced or minimized.

Further, a large areal optical coupler 200 can be used because optical waveguide 140 has a relatively large planar area. In such a case, an alignment margin between the optical fiber 220 and the optical device 170 may increase to allow the package process automation of the optical devices and to reduce the fabrication cost of the optical device packages.

Figure 25:
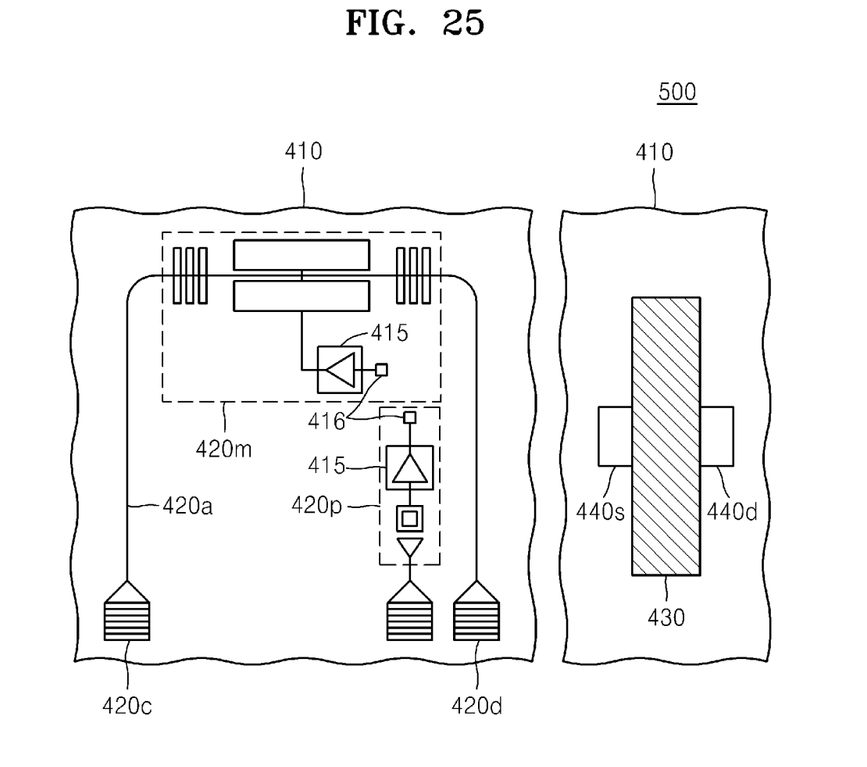
FIG. 25 is a plan view illustrating a photovoltaic integrated circuit device including an optical input/output (I/O) device fabricated using a method of forming an epitaxial layer according to some example embodiments of the inventive concepts.

FIG. 25 is a plan view illustrating a photovoltaic integrated circuit device including an optical input/output (I/O) device fabricated using a method of forming an epitaxial layer according to some example embodiments of the inventive concepts.

Specifically, a photovoltaic integrated circuit device 500 may include an optical I/O device and an electronic device which are fabricated on a substrate 410, for example, a single crystalline silicon substrate. The optical I/O device may include an optical waveguide 420*a*, a modulator 420*m*, a photo diode 420*p* and optical couplers 420*c* and 420*d*. Each of the modulator 420*m* and the photo diode 420*p* may include a MOS device 415 and an electrical contact pad 416.

The electronic device may include memory cells formed on the substrate 410. Each of the memory cells may include a transistor, for example, a MOS transistor. The MOS transistor may include a gate 430, a source 440*s* and a drain 440*d*. The memory cells of the electronic device may be dynamic random access memory (DRAM) cells or other memory cells.

The optical I/O device including the optical waveguide 420*a* and the optical couplers 420*c* and 420*d* may be formed to include epitaxial layers which are fabricated according to the embodiments. Thus, when an optical signal travels along the optical waveguide 420*a* having a width (or a length) of several tens of micrometers ($\mu$m) to several hundreds of micrometers ($\mu$m), the optical loss may be reduced.

While the inventive concepts have been particularly shown and described with reference to example embodiments thereof, it will be understood that various changes in form and details may be made therein without departing from the spirit and scope of the following claims.

What is claimed is:

1. A method of forming an epitaxial layer, the method comprising:

forming a plurality of first insulation patterns in a substrate, the plurality of first insulation patterns spaced apart from each other;

forming first epitaxial patterns on the plurality of first insulation patterns using the substrate between the plurality of first insulation patterns as a seed layer;

forming second insulation patterns between the plurality of first insulation patterns to contact the plurality of first insulation patterns; and forming second epitaxial patterns on the second insulation patterns and between the first epitaxial patterns to contact the first epitaxial patterns using the first epitaxial patterns as a seed layers, the first epitaxial patterns and the second epitaxial patterns forming a single epitaxial layer.

2. The method of claim 1, wherein one of a width and a length of each of the plurality of first insulation patterns is equal to or less than twice a maximum lateral growth length of each of the first epitaxial patterns during the forming first epitaxial patterns.

3. The method of claim 1, wherein the forming a plurality of first insulation patterns forms the plurality of first insulation patterns to have a distance between the plurality of first insulation patterns less than one of a width and a length of each of the plurality of first insulation patterns.

4. The method of claim 1, wherein a sum of one of widths and lengths of the plurality of first insulation patterns and one of widths and lengths of the second insulation patterns is within a range of several tens of micrometers ($\mu$m) to several hundreds of micrometers ($\mu$m); and one of a width and a length of the single epitaxial layer is within a range of several tens of micrometers ($\mu$m) to several hundreds of micrometers ($\mu$m).

5. The method of claim 1, wherein the forming a plurality of first insulation patterns includes:

etching the substrate to form a plurality of trenches in the substrate, the plurality of trenches spaced apart from each other; and forming a first insulation layer filling the plurality of trenches.

6. The method of claim 1, wherein the forming first epitaxial patterns includes:

forming a first amorphous source layer on the substrate and the plurality of first insulation patterns; and re-crystallizing the first amorphous source layer using an epitaxial growth process.

7. The method of claim 6, wherein the re-crystallizing re-crystallizes the first amorphous source layer using one of a solid phase epitaxial technique and a liquid phase epitaxial technique.

8. The method of claim 1, wherein the forming second insulation patterns includes:

etching the substrate between the plurality of first insulation patterns to form trenches; and forming a second insulation layer filling the trenches.

9. The method of claim 1, wherein the forming second epitaxial patterns includes:

forming a second amorphous source layer on the second insulation patterns between the plurality of first insulation patterns; and re-crystallizing the second amorphous source layer using an epitaxial growth process.

10. The method of claim 9, wherein the forming a second amorphous source layer includes:

forming holes in the second insulation patterns between the first epitaxial patterns;

forming an amorphous semiconductor layer on the first epitaxial patterns to fill the holes; and planarizing the amorphous semiconductor layer.

11. The method of claim 9, further comprising:

forming an etch stop layer on one of the first epitaxial patterns and the substrate before the forming a second amorphous source layer.

12. The method of claim 1, further comprising:

etching the plurality of first insulation patterns to form first recessed insulation patterns after the forming a plurality of first insulation patterns, the first recessed insulation patterns having a top surface located at a lower level in a vertical direction than a top surface of the substrate.

13. A method of forming an epitaxial layer, the method comprising:

forming a plurality of first trenches spaced apart from each other in a substrate;

forming first insulation patterns in the plurality of first trenches;

forming an epitaxial layer on the first insulation patterns using the substrate as a seed layer;

etching the epitaxial layer and the substrate to form second trenches between the first insulation patterns and to form first epitaxial patterns on the first insulation patterns;

forming second insulation patterns filling the second trenches and contacting the first insulation patterns; and forming second epitaxial patterns on the second insulation patterns and between the first epitaxial patterns to contact the first epitaxial patterns using the first epitaxial patterns as seed layers.

14. The method of claim 13, wherein the forming an epitaxial layer includes:

forming an amorphous source layer on the substrate and the first insulation patterns; and re-crystallizing the amorphous source layer on the first insulation patterns using the substrate between the first insulation patterns as a seed layer.

15. The method of claim 13, further comprising:

etching the first insulation patterns to form first recessed insulation patterns after the forming first insulation patterns, the first recessed insulation patterns having a top surface located at a lower level in a vertical direction than a top surface of the substrate.

16. The method of claim 15, wherein the forming second insulation patterns includes etching the second insulation patterns to form second recessed insulation patterns, the second recessed insulation patterns having a top surface located at a lower level in a vertical direction than a top surface of the substrate, the etching the epitaxial layer and the substrate forms first epitaxial patterns having a bottom surface located at a lower level in a vertical direction than a top surface of the substrate, and the forming second epitaxial patterns forms the second epitaxial patterns having a bottom surface located at a lower level in a vertical direction than a top surface of the substrate.

17. A method of forming an epitaxial layer, the method comprising:

forming first insulation patterns in a substrate;

forming first epitaxial patterns on the first insulation patterns using the substrate between the first insulation patterns as a seed layer;

forming second insulation patterns between the first insulation patterns, the first and second insulation patterns forming an insulation layer; and forming second epitaxial patterns on the second insulation patterns and between the first epitaxial patterns using the first epitaxial patterns as seed layers, the first and second epitaxial patterns forming a single epitaxial layer covering the insulation layer.

18. The method of claim 17, wherein the forming first epitaxial patterns includes:

forming a first amorphous source layer on the substrate and the first insulation patterns; and re-crystallizing the first amorphous source layer using an epitaxial growth process.

19. The method of claim 17, wherein the forming second epitaxial patterns includes:

forming a second amorphous source layer on the second insulation patterns between the first insulation patterns; and re-crystallizing the second amorphous source layer using an epitaxial growth process.

20. The method of claim 17, further comprising:

etching the first insulation patterns to form first recessed insulation patterns after the forming first insulation patterns, the first recessed insulation patterns having a top surface located at a lower level in a vertical direction than a top surface of the substrate.

* * * * *